(12) United States Patent
Botea

(10) Patent No.: US 9,589,672 B2
(45) Date of Patent: Mar. 7, 2017

(54) POWER-AWARE MEMORY SELF-TEST UNIT

(71) Applicant: Apple Inc., Cupertino, CA (US)

(72) Inventor: Dragos F. Botea, San Jose, CA (US)

(73) Assignee: Apple Inc., Cupertino, CA (US)

( * ) Notice: Subject to any disclaimer, the term of this patent is extended or adjusted under 35 U.S.C. 154(b) by 214 days.

(21) Appl. No.: 14/502,458

(22) Filed: Sep. 30, 2014

(65) Prior Publication Data

US 2016/0093400 A1    Mar. 31, 2016

(51) Int. Cl.
*G11C 29/38*  (2006.01)
*G11C 29/26*  (2006.01)

(52) U.S. Cl.
CPC .............. *G11C 29/38* (2013.01); *G11C 29/26* (2013.01); *G11C 2029/2602* (2013.01)

(58) Field of Classification Search
CPC .. G11C 29/38; G11C 29/26; G11C 2029/2602
See application file for complete search history.

(56) References Cited

U.S. PATENT DOCUMENTS

| | | | | |
|---|---|---|---|---|
| 4,574,283 A * | 3/1986 | Arakawa | ............... | H04L 1/0083 165/205 |
| 5,386,575 A * | 1/1995 | Shinkai | ............... | G06F 11/0754 324/433 |
| 6,675,336 B1 | 1/2004 | Thakur et al. | | |
| 6,895,452 B1 * | 5/2005 | Coleman | ............... | G06F 9/3879 375/E7.094 |
| 7,218,566 B1 * | 5/2007 | Totolos, Jr. | ............. | G11C 5/04 365/189.04 |
| 7,472,224 B1 * | 12/2008 | Klass | ................... | G06F 11/073 711/100 |
| 7,555,659 B2 * | 6/2009 | Lines | ..................... | G11C 5/14 365/227 |
| 7,707,472 B1 | 4/2010 | Dastidar | | |
| 8,001,434 B1 | 8/2011 | Lee et al. | | |
| 8,068,373 B1 * | 11/2011 | Totolos, Jr. | ............. | G06F 13/28 365/189.17 |
| 8,149,634 B2 * | 4/2012 | Lines | ..................... | G11C 5/14 365/189.11 |
| 8,259,522 B1 | 9/2012 | Dastidar et al. | | |
| 2007/0201295 A1 * | 8/2007 | Lines | ..................... | G11C 5/14 365/230.03 |
| 2012/0159274 A1 | 6/2012 | Balakrishnan et al. | | |
| 2013/0173970 A1 | 7/2013 | Kleveland et al. | | |
| 2014/0032819 A1 * | 1/2014 | Dang | ................... | G06F 1/3225 711/103 |

* cited by examiner

*Primary Examiner* — John J Tabone, Jr.
(74) *Attorney, Agent, or Firm* — Meyertons, Hood, Kivlin, Kowert & Goetzel, P.C.

(57) ABSTRACT

Techniques are disclosed relating to testing logic in integrated circuits based on power being received by the integrated circuit. In one embodiment, an integrated circuit includes a memory and a self-test unit. The self-test unit is configured to receive an indication that identifies a memory block as being in a low-power state and to determine whether to disregard test data read from the one or more memory banks. In some embodiments, the self-test unit may be configured to mask a portion of test result related to the test data that the self-test unit has determined to disregard. The self-test unit may include an error validation logic configured to determine a validity of test data received from a memory based on a power activation status (e.g., whether the memory is powered on or off) associated with the memory.

15 Claims, 5 Drawing Sheets

POWER-AWARE MEMORY SELF-TEST UNIT

BACKGROUND

Technical Field

This disclosure relates to integrated circuits, and, more specifically, to memory testing using built-in self-test units.

Description of the Related Art

In the semi-conductor industry, developers typically perform a variety of tests on integrated circuits (may also be referred to as "die" or "chips") after they are manufactured to verify the integrity of those circuits. To facilitate testing, integrated circuits may include built-in self-test (BIST) units configured to test the integrity of the integrated circuit. Built-in self-test units may be connected to automated test equipment (ATE) that provides inputs for various tests and analyzes the resultant outputs to determine whether problems or defects exist. Minimizing the amount of time spent testing and accurately identifying problems is important because significant numbers of integrated circuits are typically being tested simultaneously using limited ATE resources.

There is a continuous need to improve the capabilities and flexibility of BIST while reducing the complexity and time requirements of BIST testing.

SUMMARY

Various embodiments of an apparatus and methods for testing individually powered memory blocks included in a memory using a memory self-test unit are disclosed. In one embodiment, a memory may include several memory blocks or memory banks, each of which may be independently operated. For example, the memory blocks may be independently power controlled. A memory self-test unit may be configured to determine whether each of the memory blocks is powered on or off. Upon determining that a particular memory block is powered off, for example, the self-test unit may be configured to disregard the memory test result for that particular memory block because the test result may not be indicative of the operation of that memory block.

Figure 1:
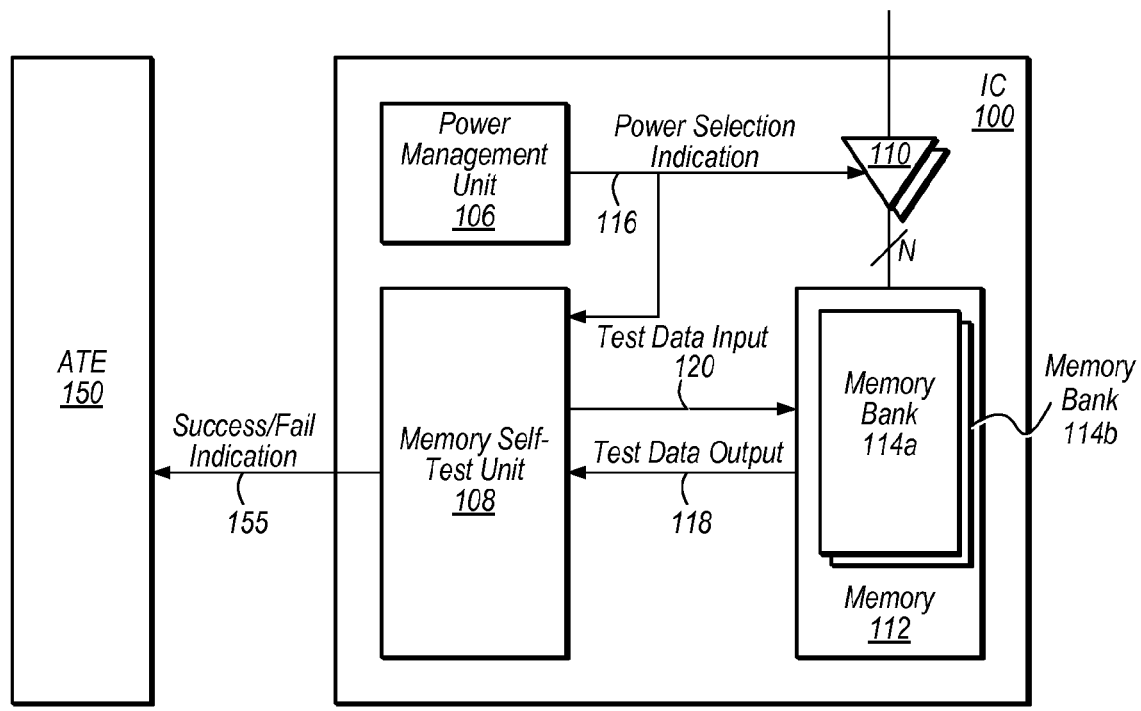
FIG. 1 is a block diagram illustrating one embodiment of an integrated circuit and a testing system configured to test the operation of an integrated circuit.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units . . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

"First," "Second," etc. As used herein, these terms are used as labels for nouns that they precede, and do not imply any type of ordering (e.g., spatial, temporal, logical, etc.). For example, in a processor having eight processing elements or cores, the terms "first" and "second" processing elements can be used to refer to any two of the eight processing elements. In other words, the "first" and "second" processing elements are not limited to logical processing elements 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Built-in self-test or BIST." As used herein, this term has its ordinary and accepted meaning in the art, and generally refers to circuitry that is included within an integrated circuit in order to test operation of the integrated circuit.

"Processor." This term has its ordinary and accepted meaning in the art, and includes a device that is capable of executing instructions. A processor may refer, without limitation, to a central processing unit (CPU), a co-processor, an arithmetic processing unit, a graphics processing unit, a digital signal processor (DSP), etc. A processor may be a superscalar processor with a single or multiple pipelines. A processor may include a single or multiple cores that are each configured to execute instructions.

"Memory." This term has its ordinary and accepted meaning in the art, and refers generally to circuitry that is configured to store information.

DETAILED DESCRIPTION

The present disclosure describes various techniques for testing integrated circuits. Such techniques may reduce the amount of time for testing integrated circuits and thus the overall production costs of those circuits. As will be described below, an integrated circuit may include a self-test unit (e.g., a BIST unit) that tests a memory that is present in the circuit. To test the memory, the BIST may provide a set of input test data to the logic to cause it to generate a corresponding set of output test data. These output test data may then be compared with an expected version of the test data to determine a test result. For example, memory on an integrated circuit may be instructed by the BIST to store input test data of 101010 (note that the data in this example is arbitrary and merely used for illustration purposes). When the memory later outputs test data of 101010, the BIST can conclude that the memory is operating as designed because the output test data matches the expected version of the test data (i.e., the version of data that indicates correct operation). The memory, however, may output test data that does not match the expected version when the memory is malfunctioning (e.g., the memory outputs test data of 111010 instead of the expected version of 101010). This mismatch may occur due to defects in integrated circuit silicon, the fabrication process, or the design of the memory, etc. In the case of a mismatch, the memory may be considered to be operating improperly or incorrectly.

In addition, the present disclosure describes various techniques for testing a memory having a plurality of independently power controlled memory blocks or memory banks. In various embodiments, a self-test circuit is disclosed that may be configured to test the plurality of memory banks while taking into account of whether each memory bank is powered on or off.

Turning now to FIG. 1, a block diagram of an integrated circuit (or IC) 100 is illustrated. Integrated circuit 100 may include memory 112, memory self-test unit 108, and power management unit 106. Integrated circuit 100 may be any type of integrated circuit that is suitable for testing. For example, in some embodiments, integrated circuit 100 is a processor, such as a central processing unit (CPU), a co-processor, an arithmetic processing unit, a graphics processing unit, a digital signal processor (DSP), etc. In some embodiments, integrated circuit 100 is a field-programmable gate array (FPGA). In some embodiments, integrated circuit 100 is an application-specific integrated circuit (ASIC).

In the illustrated embodiment, integrated circuit 100 may be coupled to Automated Test Equipment (ATE) 150. In this embodiment, ATE 150 is illustrated as a testing tool that is outside or external to integrated circuit 100. ATE 150 may contain circuitry including a number of registers along with the various application test algorithms to facilitate the testing of integrated circuit 100.

Memory 112 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, Phase Change Memory (PCM), or a Ferroelectric Random Access Memory (FeRAM), for example. Accordingly, in some embodiments, memory 112 may include volatile memory (i.e., memory that is unable to correctly store data when power is reduced). In other embodiments, memory 112 may include non-volatile memory (i.e., memory is able to store data when power is reduced); however, this data may be inaccessible when power is reduced (e.g., due to data routing logic being inoperable). While FIG. 1 depicts a single memory 112, it is noted that in other embodiments additional memories 112 may be included.

Memory 112 may be divided into a plurality of memory banks 114 (shown as banks 114a, 114b, etc. in FIG. 1). (As used herein, the terms memory bank or memory block are used broadly to refer to any portion of a memory.) In some embodiments, memory banks 114 may be configured to be operated and/or accessed independently from one another. In various embodiments, each of the plurality of memory banks 114 are configured to be independently powered controlled. As used herein, the term "power controlled" refers to the ability to restrict power supplied to a structure (e.g., a memory bank) to inhibit operation of that structure (or at least a portion of that structure). As used herein, the phrase "independently power controlled" refers to the ability to restrict power to one structure without restricting power to another—e.g., restricting power to bank 114a, but not bank 114b. As used herein, the term "power state" refers generally to whether a structure is in a state in which it is experiencing power restriction. Accordingly, a memory bank 114 may be described as being in a "low-power state" if it is experiencing power restriction and as being in an "operating-power state" (or "high-power state") if it is not being power restricted. Similarly, a bank 114 may be described as being "disabled" (or "in-active") if it is in a lower-power state and as being "enabled" (or "active") if it is not. As used herein, the term "power-activation status" refers to an indication of a structure's (or structures') power state.

Power management unit 106, in one embodiment, is configured to manage the power states of banks 114. In some embodiments, power management unit 106 may instruct a power supply (e.g., from an external power source, not shown in FIG. 1) to enable or disable memory banks 114. In the illustrated embodiment, power management unit 106 provides power selection indication 116 to controllers 110 to control the power being supplied. In some embodiments, power selection indication 116 may alter the power state of banks 114 by instructing controllers 110 to power-gate and/or clock-gate banks 114. Accordingly, in one embodiment, controllers 110 may be gates (i.e., switches) controllable by power management unit 106. In the illustrated embodiment, power management unit 106 is configured to also provide to memory self-test unit 108 indication 116, which may identify the power-activation status of memory banks 114 (e.g., identifying which banks are in a low-power state and/or which banks are in a high-power state).

Memory self-test unit 108 is one embodiment of a BIST unit that is configured to test whether integrated circuit 100 (and specifically memory 112) operates properly (i.e., as designed). In such an embodiment, memory self-test 108 may be configured to generate test data (shown as test data input 120) and instruct memory 112 to store the data within banks 114. Upon reading the test data from memory 112 (shown as test data output 118), memory self-test unit 108 may use the test data to determine whether memory 112 is operating as designed. In one embodiment, this determination may be based on whether test data input 120 matches test data output 118 as a match may indicate that memory 112 is correctly storing the data (e.g., the data is not becoming corrupted due to faulty memory cells, data routing logic, faulty design, etc.). Referring to the example described earlier, if the value of 101010 is stored in memory bank 114a, yet bank 114a outputs the value of 111111, this discrepancy may indicate that memory 112 (specifically bank 114a) is not correctly storing data. On the other hand, when memory bank 114 operates as designed, test data output 118 should match the input value of 1010101—the expected value in this example. In the illustrated embodiment, memory self-test unit 108 is configured to provide a success/fail indication 155 indicative of the determination to ATE 150. In some embodiments, indication 155 may also include additional diagnostic information usable by ATE 150 such as data produced from the comparison of test data input 120 and test data output 118.

As noted earlier, memory self-test unit 108 may be configured to receive power selection indication 116, which may identify, for example, one or more of memory banks 114 as being in a low-power state. In various embodiments, memory self-test unit 108 is configured to consider the power-activation status of banks 114 in its analysis of whether memory 112 is operating correctly. As will be described below in conjunction with FIG. 2, in one embodiment, if memory self-test unit 108 receives an indication that a particular bank 114 (e.g., bank 114a) is in a lower-power state, memory self-test unit 108 may be configured to disregard any comparison results that were generated based on data read from the bank 114 as any data obtained from the bank may not be reflective of successful operation. In such an embodiment, however, memory self-test unit 108 may still provide a success/fail indication 155 for memory 112 based on the remaining banks 114 that are not in a lower-power state. Thus, if bank 114a is in a lower-power state and bank 114b is not, memory self-test unit 108 may still indicate that memory 112 is operating correctly as long as the test data output 118 from bank 114b matches the expected output. In other embodiments, memory self-test unit 108 may even determine to forgo any comparison using data from a disabled bank 114. For example, in one embodiment, if bank 114a is disabled, memory self-test unit 108 may not attempt to read data from bank 114a (or, in another embodiment, may attempt to read the data from bank 114 but not supply the data to comparison logic within memory self-test unit 108).

Figure 2:
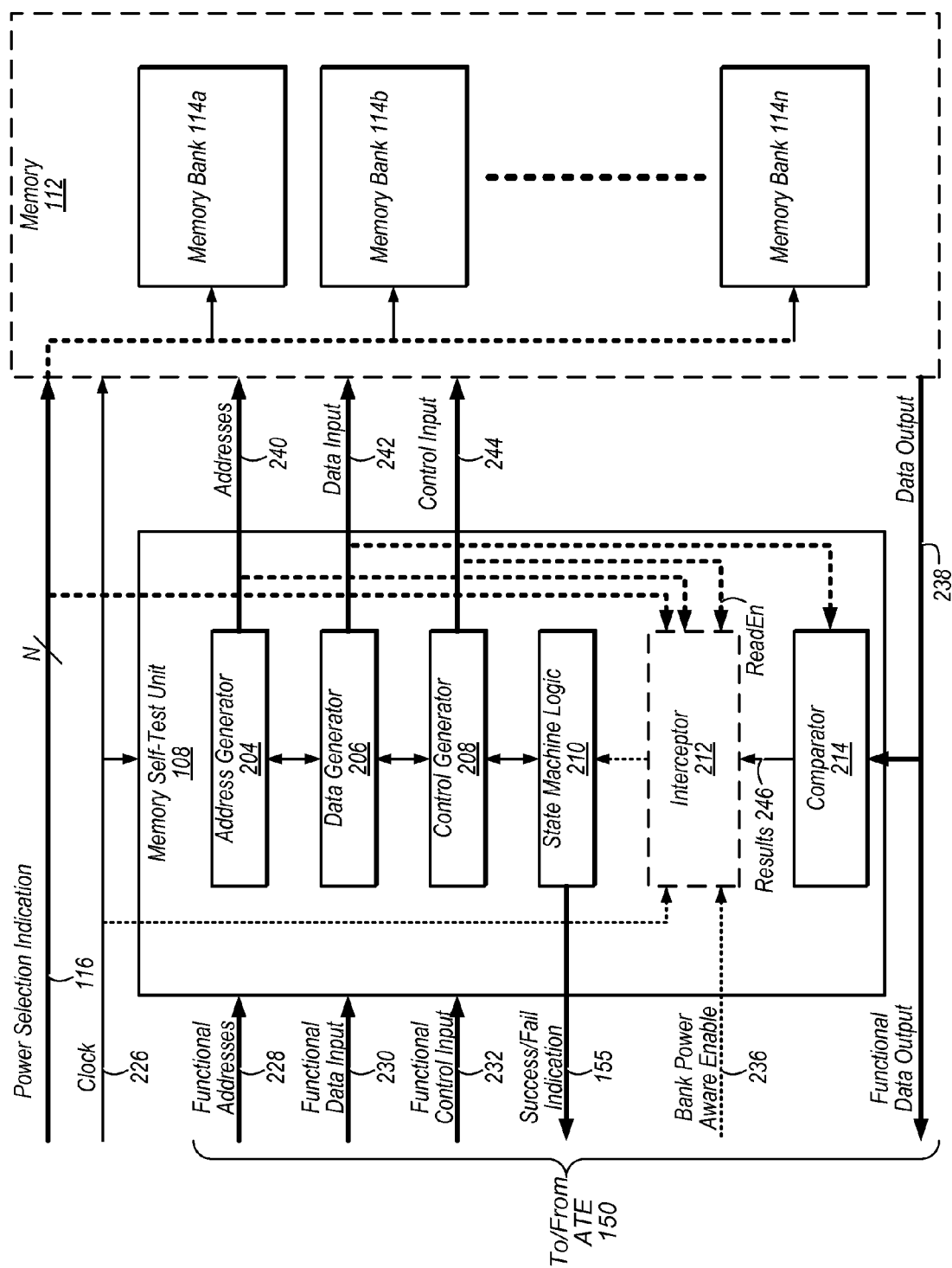
FIG. 2 is a block diagram illustrating one embodiment of a built-in-self-test (BIST) unit configured to test the operation of a system.

Turning now to FIG. 2, a block diagram of memory self-test unit 108 is depicted. In the illustrated embodiment, memory self-test unit 108 includes an address generator 204, data generator 206, control generator 208, and state machine logic 210, interceptor 212, and comparator 214. In other embodiments, memory self-test unit 108 may be implemented differently than shown. It is noted that memory 112 is shown with a dotted line to indicate that it is not included within memory self-test unit 108 in the illustrated embodiment.

Address generator 204 may be configured to determine particular addresses 240 to be tested (i.e., addresses to be written to or read from during a test). In some instances, theses addresses may include either the entire set of addresses in memory 216 or alternatively, a subset thereof. In the illustrated embodiment, ATE 150 may provide an indication of a desired address range to be generated by generator 204 and tested by memory self-test unit 108 via functional addresses 228. In some embodiments, address generator 204 may convey addresses 240 to circuitry other than memory 112 such as interceptor 212 (as indicated by the dotted line).

Data generator 206, in one embodiment, is a programmable data generator that generates data input 242 for testing operation of memory 112. Accordingly, data generator 206 may be programmable to generate a desired pattern such as all 1s, all 0s, a checkerboard pattern, a pseudorandom number sequence, etc. In the illustrated embodiment, ATE 150 may indicate a desired test pattern (and, in one embodiment, specify a random seed) via functional data input 230. In one embodiment, data generator 206 may also provide data input 242 to comparator 214 discussed below.

Control generator 208 may be configured to produce a control input 244 for managing operation of memory 112. In one embodiment, control input 244 may include read-enable and write-enable signals that identify whether memory self-test unit 108 is requesting a read operation or a write operation. In one embodiment in which memory 112 is a multi-port memory, control input 244 may further specify desired ports to be used during requested operations. In the illustrated embodiment, ATE 150 may indicate a desired control input via functional control input 232. In some embodiments, control generator 208 may also provide control input 244 (particularly the read enable signals of input 244, in the illustrated embodiment) to interceptor 212.

State machine logic 210 may be configured to manage operation of memory self-test unit 108 by generating instructions for units 204-214. In one embodiment, state machine logic 210 may be configured to provide instructions to control generator 208 based on an implemented sequence of states (e.g., a wait state, a cause state, etc.) and coordinate with data generator 206's generation of a sequence of test patterns. In the illustrated embodiment, state machine 210 may also be configured to generate success/fail indication 155. Although shown as a single block for illustration purposes, in some embodiments, logic 210 may be interspersed among other units 204-214.

Comparator 214 may be configured to compare data output 238 from memory 112 with an expected version of test data—e.g., data input 242 received from data generator 206, in the illustrated embodiment. In illustrated embodiment, comparison unit 214 is further configured to provide comparison results 246 to state machine logic 210. For example, data output 238 may include a value read from one of memory banks 114, such as memory bank 114a. Upon receiving this value, comparator 214 may compare it with its corresponding expected value received from data generator 206. If the values match, comparator 214 may indicate a result 246 specifying a match for the bank 114. On the other hand, if a mismatch is detected, comparator 214 may provide a result 246 indicating a mismatch. In one embodiment, state machine logic 210 may analyze multiple results 246 from different banks 114 in determining whether memory 112 is functioning correctly.

Interceptor 212, in one embodiment, is configured to intercept (i.e., filter) comparison results 246 pertaining to disabled memory banks 114. In doing so, interceptor 212 may prevent state machine logic 210 from considering results from disabled banks 114 that may cause a false determination that memory 112 is operating incorrectly. In some embodiments, interceptor 212 may be configured to modify comparison results 246 for disabled banks 114 by masking the results associated with the banks 114. For example, if comparator 214 asserts a logical 1 upon identifying a match, interceptor 212 may be configured to replace any result of a disabled bank 114 with a logical 1 regardless of the actual result 246 indicated by comparator 214. Thus, interceptor 212 may indicate a successful match even though comparator 214 concluded otherwise.

Interceptor 212 may be configured to identify results 246 for interception by comparing addresses 240 and power selection indication 116 to determine whether a particular address being tested corresponds to a particular memory bank 114 that has been deactivated. Accordingly, interceptor 212 may receive a test address 240 and a result 246 associated with the address. Interceptor 212 may then determine that the test address 240 corresponds to a disabled bank 114 based on indication 116. For example, in one embodiment, interceptor 212 may decode an address 240 to identify the bank 114 to which it pertains—e.g., as identified by the most significant bits in the address. Upon determining that the address 240 relates to a disabled bank 114, interceptor 212 may then mask the corresponding result 246 to prevent it from being analyzed by state machine logic 210. In the illustrated embodiment, timing between memory 112 and memory self-test unit 108 (including interceptor 212) is coordinated using the same clock signal 226.

In the illustrated embodiment, interceptor 212 may be configured to be activated by bank power aware enable signal 236. Upon being activated, interceptor 212 may receive control input 244 from control generator 208, test addresses 240 from address generator 204, and power selection indication 116. Note that interceptor 212 and its accompanying inputs are indicate with dotted line to indicate that interceptor 212 may function as a pass-through circuit when disabled, in some embodiments. Accordingly, when interceptor 212 is deactivated, memory-self test unit 108 may test the operation of memory 112 without considering the power states of banks 114.

Although interceptor 212 is depicted between state machine logic 210 and comparator 214, interceptor 212 may be located elsewhere in other embodiments. In an alternative embodiment, interceptor 212 located before or upstream of comparator 214—i.e., it may intercept data output received from deactivated memory banks 114 prior to comparator 214 comparing the data output. In such an embodiment, interceptor 212 may be configured to mask portions of data output 238 received from disabled banks 114, so that comparator 214 identifies a match regardless of the actual data within the portion. In another embodiment, interceptor 212 may also be located between state machine logic 210 and ATE 150. In such an embodiment, interceptor 212 may be configured to mask any indication 155 that identifies the memory 112 as not operating correctly if the state machine logic 210 relied on data from a disabled bank 114.

Figure 3:
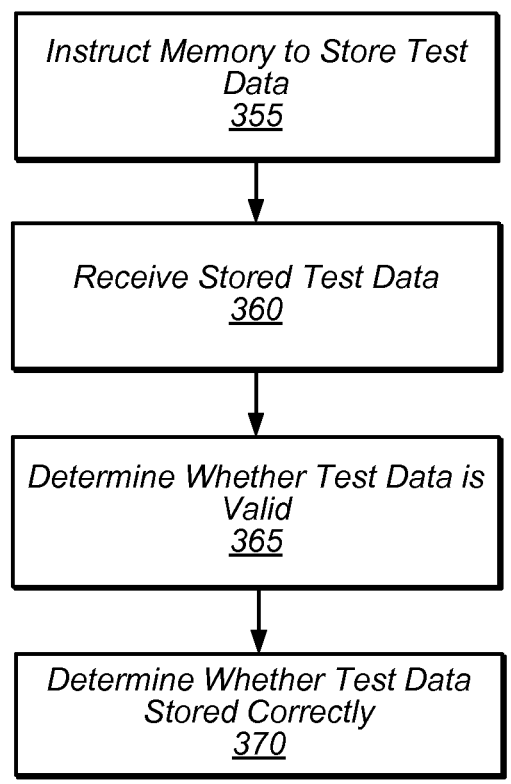
FIG. 3 is a flow diagram illustrating one embodiment of a method for testing the operation of an integrated circuit using a memory self-test unit.

Turning now to FIG. 3, a flow diagram of a method 350 is depicted. Method 350 is one embodiment of a method that may be performed by an integrated circuit that includes a memory self-test unit such as integrated circuit 100. In some instances, performing method 350 may reduce testing time and improve manufacturing yield.

In step 355, a circuit (e.g., memory self-test unit 108) instructs a memory (e.g., memory 112) to store test data. The test data may be generated by a data generator (e.g., data generator 204) included in the memory self-test unit. The circuit may instruct the memory to store test data according to test addresses generated by an address generator of the circuit. The data generator and the address generator may be controlled by a control generator included in the circuit. In one embodiment, the memory includes a plurality of memory banks or memory blocks each of which may be operated independently. The circuit accordingly instructs each of the plurality of memory blocks to store test data accordingly.

In step 360, the circuit receives the stored test data from the memory. That is, subsequent to the circuit instructing the memory to store the test data, the circuit may proceed with receiving the stored test data from the memory. In the embodiment described above, the circuit may receive the stored test data from each of the plurality of memory blocks.

In step 365, the circuit determines whether the received test data in step 360 is valid based on a power activation status of the memory. Specifically, the circuit may receive a power activation signal indicating that a portion of the plurality of memory blocks has been disabled and is thus associated with a disabled power activation status. The power activation signal may also indicate that a remaining portion of the plurality of memory blocks has been enabled and is thus associated with an enabled power activation status. In an alternative embodiment, a power activation signal may indicate to the circuit that a particular test address is associated with an enabled or disabled power activation status. Based on the respective power activation status of each of the memory blocks (or corresponding to test addresses to which test data is stored), the circuit identifies that a portion of the received test data as being valid because it is received from those memory blocks associated with an enabled power activation status and that a remaining portion of received test data as being invalid because the data is received from those memory blocks associated with a disabled power activation status. In one embodiment, when a first one of the plurality of memory blocks is associated with a disabled power activation status, the circuit determines that the test data received from the first memory block is invalid. On the other hand, when a second and third of the plurality of memory blocks are associated with an enabled power activation status, the circuit determines that the test data received from the second and third memory blocks is valid.

In step 370, the circuit conducts a determination of whether the memory correctly stored the test data as instructed in step 355. The circuit may, for example, compare the test data received from the memory and an expected version of the test data had the memory operated correctly to determine whether they correspond or match. In conducting the comparison, the circuit instructs to reject using the test data determined to be invalid in step 365. In one embodiment, the circuit instructs to exclude from the comparison invalid test data received from the first memory block and to determine the test result by comparing valid test data received from the second and third memory blocks and the expected version of the test data.

In various embodiments, steps 355-370 may be repeated for multiple portions of the memory in order to conclude whether memory is operating as designed.

Figure 4:
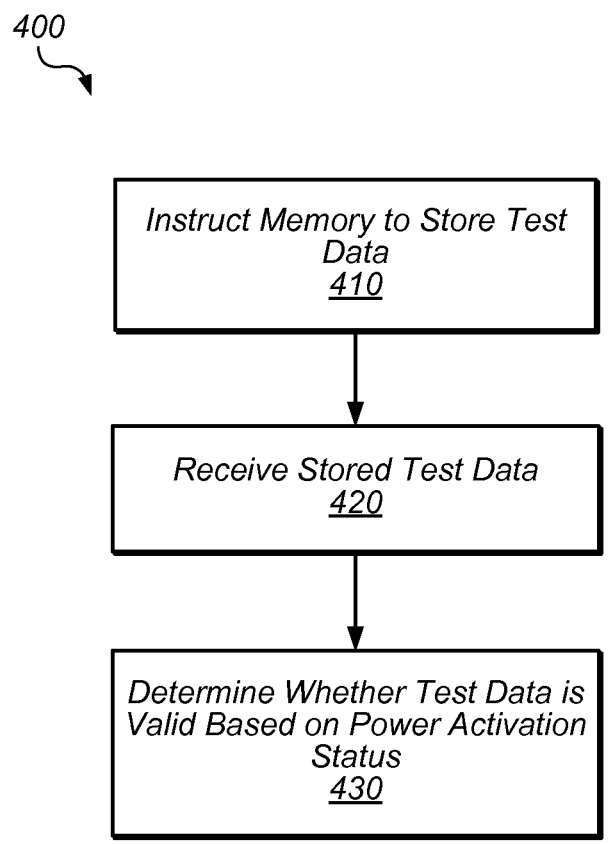
FIG. 4 is a flow diagram illustrating another embodiment of a method for testing the operation of an integrated circuit using a memory self-test unit.

Turning now to FIG. 4, a flow diagram of a method 400 is depicted. Method 400 is an embodiment of a method that may be performed by an integrated circuit that includes a memory self-test unit such as integrated circuit 100. In some instances, performing method 400 may reduce testing time and improve manufacturing yield.

In step 410, a circuit (e.g., memory self-test unit 108) instructs a memory (e.g., memory 112) to store test data (e.g., data input 242). In various embodiments, the memory includes a plurality of memory blocks (e.g., banks 114) that are independently power controlled.

In step 420, the circuit receives the stored test data (e.g., data output 238) from the memory. In some instances, the test data may include data retrieved from one or more blocks that are in a low-power state.

In step 430, the circuit determines whether the received test data is valid based on a power activation status of the memory (e.g., as indicated by power selection indication 116). In one embodiment, the power activation status indicates that a particular memory block included in the memory is disabled. In such an embodiment, step 430 may include the circuit determining, based on the power activation status, that a portion of the received test data corresponding to the particular memory block is invalid, and in response to determining that the portion of the received test data is invalid, the circuit generating a test result (e.g., a result 246) of the memory that identifies the portion of the received test data as invalid. In some embodiments, step 430 may include, the circuit detecting, based on a power activation signal associated with a particular test address, that a first one of a plurality of memory blocks included in the memory is associated with a disabled power activation status. In response to the detecting, the circuit may reject the test data received from the first memory block in a determination of whether the memory correctly stored the test data.

In some embodiments, method 400 may further include detecting, by the circuit, that the memory failed a memory test based on a test result indicating that the memory test output data does not match an expected version of test data. In such an embodiment, method 400 may further include, in response to the detecting, the circuit validating the test result, where the validating includes the circuit determining that each of a plurality of memory blocks included in the memory is associated with an enabled power status. In some embodiments, method 400 may further include, in response to receiving a power bank aware signal (e.g., power selection indication 116), the circuit instructing to activate an error validation logic (e.g., interceptor 212). Upon being activated, the error validation logic may determine based on the power activation status associated with the memory, whether to override the test data received with an expected version of test data (e.g., masking over portions of data output 238 in a manner that causes comparator 214 to indicate a match for a disabled bank).

Figure 5:
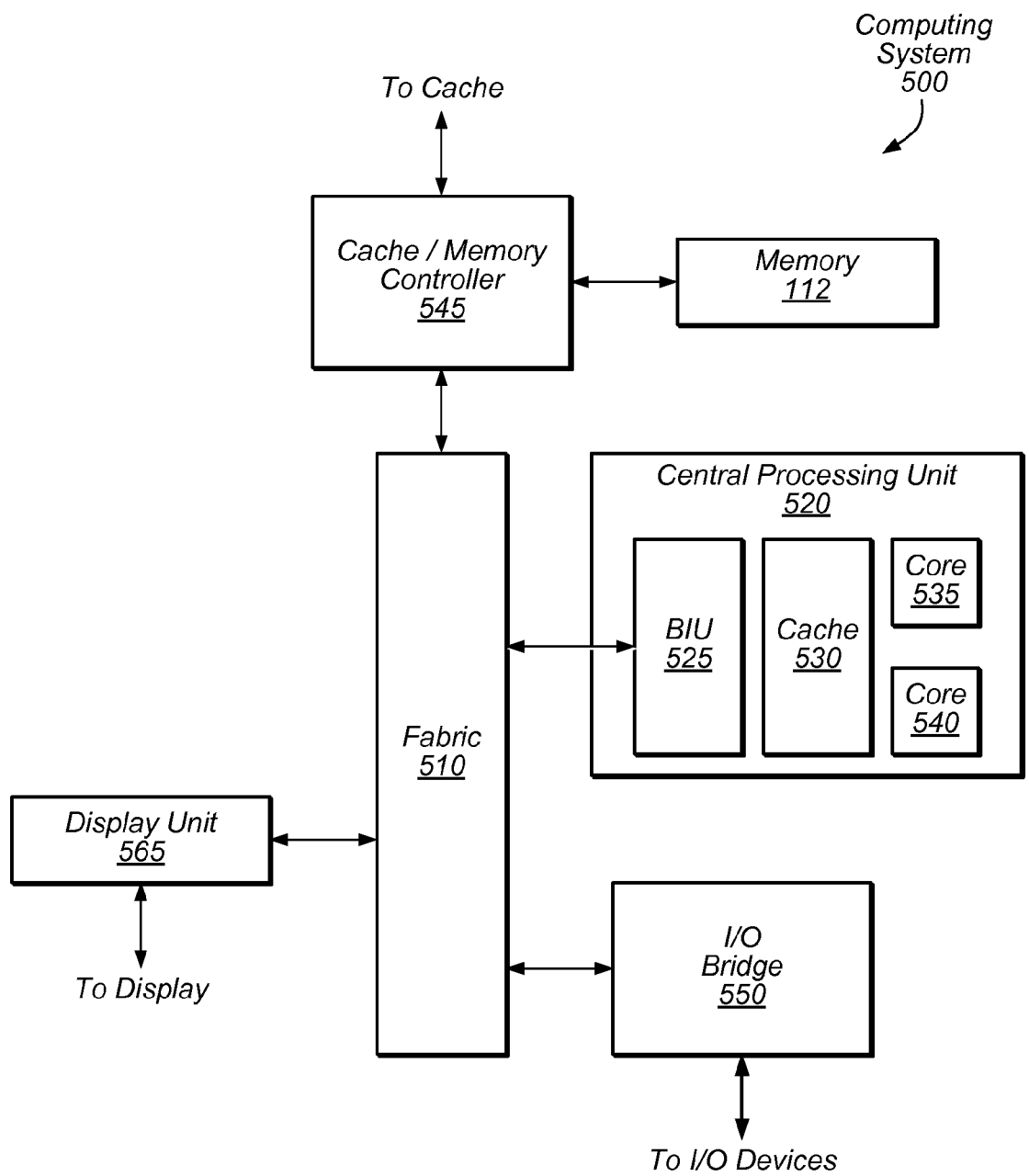
FIG. 5 is a block diagram illustrating one embodiment of an exemplary computing system.

Turning now to FIG. 5, a block diagram illustrating an exemplary embodiment of a computing system 500 is shown. Computing system 500 is one embodiment of a computing system that includes the memory 112 discussed above. In some embodiments, elements of computing system 500 may be included within a system on a chip (SoC) (e.g., in one embodiment, integrated circuit 100 may be implemented as an SoC). In some embodiments, computing system 500 is included in a mobile device, which may be battery-powered. Therefore, power consumption by computing system 500 may be an important design consideration. In the illustrated embodiment, computing system 500 includes fabric 510, central processing unit (CPU) 520, input/output (I/O) bridge 550, cache/memory controller 545, memory 112, and display unit 565.

Fabric 510 may include various interconnects, buses, MUX's, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, CPU 520 includes bus interface unit (BIU) 525, cache 530, and cores 535 and 540. In various embodiments, CPU 520 includes various numbers of cores and/or caches. For example, CPU 520 may include 1, 2, or 4 processor cores, or any other suitable number. In one embodiment, cache 530 is a set associative L2 cache. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between CPU 520 and other elements of computing system 500. Processor cores such as cores 535 and 540 may be configured to execute instructions of a particular instruction set architecture (ISA), which may include operating system instructions and user application instructions.

Cache/memory controller 545 may be configured to manage transfer of data between fabric 510 and one or more caches and/or memories. For example, cache/memory controller 545 may be coupled to an L3 cache, which may, in turn, be coupled to a system memory. In the illustrated embodiment, cache/memory controller 545 is directly coupled to the memory 112. In other embodiments, the cache/memory controller 545 is coupled to the memory 112 via one or more caches. In some embodiments, the cache/memory controller 545 includes one or more internal caches. In another embodiment, other memories are also coupled to the cache/memory controller 545.

As used herein, the term "coupled to" may indicate one or more connections between elements, and a coupling may include intervening elements. For example, in FIG. 5, display unit 565 may be described as "coupled to" the memory 112 through fabric 510 and cache/memory controller 545. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550.

\* \* \*

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An integrated circuit, comprising:
a memory self-test unit configured to perform a test operation of a memory that includes:
writing test data to a plurality of memory banks of the memory, wherein each of the plurality of memory banks is independently power controlled;
reading the test data from the plurality of memory banks of the memory;
receiving an indication that identifies one or more of the plurality of memory banks as being in a low-power state; and
based on the indication, determining whether to disregard, from the test operation, the test data read from the one or more memory banks identified as being in the low-power state.

2. The integrated circuit of claim 1, wherein the test operation further includes:
comparing the test data read from the plurality of memory banks with an expected version of the test data; and
indicating a result of the test operation to an external test tool, wherein the memory self-test unit is configured to mask a portion of the result related to the test data read from the one or more memory banks identified as being in the low-power state in response to determining to disregard the test data read from the one or more memory banks identified as being in the low-power state.

3. The integrated circuit of claim 1, wherein the memory self-test unit is configured to:
in response to determining to disregard the test data read from the one or more memory banks identified as being in the low-power state, replace the test data read from the identified one or more memory banks with default test data.

4. The integrated circuit of claim 1, further comprising:
a power management unit, wherein the power management unit is configured to:
instruct a power supply to place the one or more memory banks in the low-power state; and
provide, to the memory self-test unit, the indication that identifies the one or more memory banks as being in the low-power state.

5. The integrated circuit of claim 1, wherein ones of the plurality of memory banks are configured to switch from the low-power state to an operating-power state corresponding to the indication received by the memory self-test unit.

6. The integrated circuit of claim 1, further comprising: the memory that includes the plurality of memory banks.

7. A method, comprising:
a circuit instructing a memory having a plurality of blocks to store test data, wherein the memory stores the test data in response to the instructing;
the circuit receiving the test data from the memory;
the circuit receiving a power activation status indicating that one or more memory blocks of the plurality of blocks are deactivated; and
the circuit determining whether the received test data is valid based on the power activation status of the memory.

8. The method of claim 7, wherein the determining includes performing a comparison of the received test data with an expected version of the test data and wherein the method further comprises:
based on the power activation status, the circuit determining that a portion of the received test data is invalid, wherein the portion corresponds to the one or more memory blocks indicated as being deactivated; and
in response to determining that the portion of the received test data is invalid, the circuit excluding the portion from the comparison.

9. The method of claim 7, further comprises:
based on the power activation status further indicating that another of the plurality of memory blocks of the memory is activated, the circuit performing a first memory test that includes analyzing a first set of test data received from the other memory block;
subsequent to the first memory test, the circuit detecting that the power activation status associated with the other memory block has been changed, wherein the changed power activation status indicates that the other memory block is deactivated; and
based on detecting that the power activation status has been changed, the circuit performing a second memory test that excludes a second set of test data received from the other memory block.

10. The method of claim 7, further comprising:
receiving, from a power management unit, a power bank aware signal for activing an error validation logic;
in response to receiving the power bank aware signal, the circuit instructing the error validation logic to activate; and
upon being activated, the error validation logic determining based on the power activation status associated with the memory, whether to override the received test data from the one or more memory blocks indicated as being deactivated with an expected version of the test data.

11. A system, comprising:
a memory that includes a plurality of memory banks; and
a built-in self-test (BIST) unit configured to:
receive a power selection signal that controls whether power is provided to ones of the plurality of memory banks; and
analyze test data output from the memory, and wherein analyzing the test data includes:
based on the power selection signal indicating that power is restricted for at least one of the plurality of memory banks, determining to mask one or more portions of the test data, wherein the one or more portions are output from the at least one memory bank.

12. The system of claim 11, wherein the system is a system-on-a-chip (SoC), and wherein the system further comprises:
an interceptor unit configured to mask the one or more portions of the test data output from the at least one memory bank by filtering, from the test data output from the memory, the one or more portions of the test data output from the at least one memory bank.

13. The system of claim 11, wherein the BIST unit is further configured to, in response to determining to mask the one or more portions of the test data output from the at least one memory bank, replace the one or more portions of the test data with default test data and compare the default test data with an expected version of the one or more portions of the test data.

14. The system of claim 11, wherein the BIST unit is further configured to determine, based on the power selection signal indicating that power is being received by a particular memory bank, that a valid error is associated with the particular memory bank, and wherein the BIST unit is further configured to confirm that the particular memory bank failed to operate properly based on the valid error.

15. The system of claim 11, wherein the at least one memory bank is configured to activate or deactivate independent of respective power levels associated with other ones of the plurality of memory banks.

\* \* \* \* \*